United States Patent
Ro et al.

(10) Patent No.: US 9,035,300 B2
(45) Date of Patent: May 19, 2015

(54) ARRAY SUBSTRATE COMPRISING A THIN FILM TRANSISTOR AND A PIXEL ELECTRODE

(71) Applicant: Samsung Display Co., Ltd., Yongin, Gyeonggi-Do (KR)

(72) Inventors: Sung-In Ro, Hwaseong-si (KR); Eun-Je Jang, Hwaseong-si (KR); Hyun-Wuk Kim, Yongin-si (KR); Ock-Soo Son, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/081,066

(22) Filed: Nov. 15, 2013

(65) Prior Publication Data

US 2014/0346496 A1    Nov. 27, 2014

(30) Foreign Application Priority Data

May 24, 2013    (KR) .................. 10-2013-0059191

(51) Int. Cl.
*H01L 27/00* (2006.01)
*H01L 27/12* (2006.01)
*H01L 29/66* (2006.01)
*H01L 29/786* (2006.01)
*H01L 27/32* (2006.01)
*H01L 51/52* (2006.01)
*H01L 29/423* (2006.01)

(52) U.S. Cl.
CPC ........ *H01L 27/1248* (2013.01); *H01L 27/1262* (2013.01); *H01L 29/66765* (2013.01); *H01L 29/78633* (2013.01); *H01L 27/3244* (2013.01); *H01L 51/5271* (2013.01); *H01L 27/3272* (2013.01); *H01L 29/42384* (2013.01); *H01L 27/3262* (2013.01); *H01L 27/322* (2013.01); *H01L 27/1214* (2013.01); *H01L 27/124* (2013.01); *H01L 27/12* (2013.01)

(58) Field of Classification Search
CPC .............. H01L 27/1214; H01L 27/124; H01L 27/3244; H01L 27/12; H01L 29/42384; H01L 27/322; H01L 29/66765; H01L 29/78633; H01L 27/3262; H01L 27/3272; H01L 51/5271

See application file for complete search history.

(56) References Cited

U.S. PATENT DOCUMENTS

| | | |
|---|---|---|
| 5,327,001 A | 7/1994 | Wakai et al. |
| 5,708,485 A | 1/1998 | Sato et al. |
| 5,818,552 A | 10/1998 | Sato |

(Continued)

FOREIGN PATENT DOCUMENTS

| | | |
|---|---|---|
| JP | 09-033950 A | 2/1997 |
| JP | 09-050044 A | 2/1997 |

(Continued)

*Primary Examiner* — Ngan Ngo
(74) *Attorney, Agent, or Firm* — Cantor Colburn LLP

(57) ABSTRACT

An array substrate includes a thin film transistor on a substrate, a color pattern on the substrate, a light blocking pattern on the thin film transistor, an organic insulation layer covering the color pattern and the light blocking pattern, a pixel electrode on the organic insulation layer, and a low-reflective pattern on the pixel electrode. An opening portion is defined in the light blocking pattern and exposes the thin film transistor. A contact hole is defined in the organic insulation layer and corresponding to the opening portion. The pixel electrode is electrically connected to the thin film transistor through the contact hole. The low-reflective pattern corresponds to the opening portion.

10 Claims, 13 Drawing Sheets

(56) References Cited

U.S. PATENT DOCUMENTS

| | | |
|---|---|---|
| 6,429,916 B1 | 8/2002 | Nakata et al. |
| 7,236,220 B2 | 6/2007 | Kim et al. |
| 7,495,728 B2 | 2/2009 | Kim et al. |
| 7,545,463 B2 | 6/2009 | Park |
| 7,973,869 B2 | 7/2011 | Lee |
| 7,995,162 B2 | 8/2011 | Kim et al. |
| 2007/0146591 A1* | 6/2007 | Kimura et al. ............. 349/114 |
| 2011/0084267 A1* | 4/2011 | Yamazaki et al. ............. 257/43 |

FOREIGN PATENT DOCUMENTS

| | | |
|---|---|---|
| JP | 10-026769 A | 1/1998 |
| JP | 11-038437 A | 2/1999 |
| JP | 11-212118 A | 8/1999 |
| JP | 2002-319321 A | 10/2002 |

* cited by examiner

ARRAY SUBSTRATE COMPRISING A THIN FILM TRANSISTOR AND A PIXEL ELECTRODE

This application claims priority to Korean Patent Application No. 10-2013-0059191, filed on May 24, 2013, and all the benefits accruing therefrom under 35 U.S.C. §119, the contents of which in its entirety is herein incorporated by reference.

BACKGROUND

1. Field

Exemplary embodiments of the invention relate to an array substrate and a method of manufacturing the array substrate. More particularly, exemplary embodiments of the invention relate to an array substrate and a method of manufacturing the array substrate for reducing contamination of liquid crystal layer.

2. Description of the Related Art

In a liquid crystal display (hereinafter, "LCD") device, light transmissivity through an array substrate and a facing substrate may be adjusted to display an image according to an arrangement of liquid crystals of a liquid crystal layer between the substrates. A plurality of signal electrodes may be disposed on the array substrate to control the arrangement of the liquid crystals.

In the LCD device, a light blocking pattern, a color filter pattern, an overcoating layer and a column spacer may be disposed on the facing substrate. The light blocking pattern may correspond to a boundary of pixel areas. The color filter pattern may correspond to the pixel areas. The overcoating layer may reduce outgassing of the light blocking pattern and the color filter pattern. The column spacer may maintain cell gap between the array substrate and the facing substrate.

SUMMARY

One or more exemplary embodiment of the invention provides an array substrate capable of reducing contamination of a liquid crystal layer and sufficiently blocking light at the boundary of pixel areas.

Also, one or more exemplary embodiment of the invention provides a method of manufacturing the array substrate.

In an exemplary embodiment of an array substrate according to the invention, the array substrate includes a thin film transistor on a substrate, a color pattern on the substrate, a light blocking pattern overlapping the thin film transistor, an organic insulation layer covering the color pattern and the light blocking pattern, a pixel electrode on the organic insulation layer, and a low-reflective pattern on the pixel electrode. An opening portion is defined in the light blocking pattern and exposes the thin film transistor. A contact hole is defined in the organic insulation layer and corresponding to the opening portion. The pixel electrode is electrically connected to the thin film transistor through the contact hole. The low-reflective pattern corresponds to the opening portion.

In an exemplary embodiment, the low-reflective pattern may include an opaque metal.

In an exemplary embodiment, the low-reflective pattern may include chromium, nickel, molybdenum, titanium, or an oxide thereof.

In an exemplary embodiment, the array substrate may further include a column spacer on the organic insulation layer and overlapping the light blocking pattern.

In an exemplary embodiment, the column spacer may include a transparent material.

In an exemplary embodiment, a portion of the light blocking pattern may overlap the color pattern, and a first height of the portion of the light blocking pattern overlapping the color pattern may be greater than a second height of a portion of the light blocking pattern exposing the color pattern, the heights taken with respect to the substrate.

In an exemplary embodiment, the array substrate may further include a plurality of slits defined in the pixel electrode.

In an exemplary embodiment, the color pattern may include a colored photoresist material.

In an exemplary embodiment, the thin film transistor may include a gate electrode disposed on the substrate, a semiconductor pattern overlapping the gate electrode, and a source electrode and a drain electrode both electrically connected to the semiconductor pattern.

In an exemplary embodiment, an area of the low-reflective pattern may be substantially greater than an area of the opening portion.

In an exemplary embodiment of a method of manufacturing an array substrate according to the invention, a thin film transistor is provided on a substrate. The thin film transistor includes a gate electrode, a semiconductor pattern, a source electrode and a drain electrode. A first passivation layer is provided on the thin film transistor. A color pattern is provided on the first passivation layer. A light blocking pattern is provided overlapping the color pattern. An opening portion is defined in the light blocking pattern and exposes the thin film transistor. An organic insulation layer is provided on the color pattern and the light blocking pattern. A contact hole is formed penetrating the organic insulation layer and the first passivation layer, to expose a portion of the drain electrode. A pixel electrode layer is provided on the organic insulation layer. The pixel electrode layer is electrically connected to the drain electrode through the contact hole. A low-reflective metal layer is provided on the pixel electrode layer. The pixel electrode layer and the low-reflective metal layer are patterned to form a pixel electrode pattern and a low-reflective pattern both overlapping the opening portion.

In an exemplary embodiment, in the providing the pixel electrode pattern and the low-reflective pattern, a first photoresist pattern may be provided on the low-reflective metal layer. The first photoresist pattern may have a first height on a portion corresponding to the opening portion and a second height less than the first height. Exposed portions of the low-reflective metal layer and the pixel electrode layer may be sequentially etched using the first photoresist pattern to form a low-reflective intermediate pattern and the pixel electrode pattern. The first photoresist pattern may be partially removed to form a second photoresist pattern on the opening portion and to expose a portion of the low-reflective intermediate pattern. The exposed portion of the low-reflective intermediate pattern may be etched to form the low-reflective pattern.

In an exemplary embodiment, a common electrode pattern may be provided on the organic insulation layer. A second passivation layer may be provided covering the common electrode pattern. The providing the contact hole may penetrate the organic insulation layer, and the first and second passivation layers.

In an exemplary embodiment, the common electrode pattern may overlap the pixel electrode pattern.

In an exemplary embodiment, a column spacer may be further provided on the second passivation layer and overlapping the light blocking pattern.

In an exemplary embodiment, the column spacer may include a transparent material.

In an exemplary embodiment, in the providing the pixel electrode pattern and the low-reflective pattern, a first photoresist pattern may be provided on the low-reflective metal layer. The first photoresist pattern may have a substantially uniform height taken with respect to the substrate. Exposed portions of the low-reflective metal layer and the pixel electrode layer may be sequentially etched using the first photoresist pattern to form a low-reflective intermediate pattern and the pixel electrode pattern. The first photoresist pattern may be partially removed to form a second photoresist pattern on the opening portion and to expose a portion of the low-reflective intermediate pattern. The exposed portion of the low-reflective intermediate pattern may be etched to form the low-reflective pattern.

In an exemplary embodiment, in the partially removing the first photoresist pattern to form a second photoresist pattern, the second photoresist pattern is disposed in the contact hole which penetrates the organic insulation layer, and the first and second passivation layers.

In an exemplary embodiment, the low-reflective pattern may include an opaque metal.

In an exemplary embodiment, the low-reflective pattern may include chromium, nickel, molybdenum, titanium, or an oxide thereof.

According to one or more exemplary embodiment of the array substrate and the method of manufacturing the array substrate, the light blocking pattern disposed on the array substrate may be covered by the organic insulation layer, and an opening portion in the light blocking pattern corresponding to the contact hole may be covered by the low-reflective pattern, thereby reducing contamination of the liquid crystal layer due to the light blocking pattern and reducing light-leakage from a backlight source through the contact hole.

Also, the column spacer disposed on the array substrate may include a transparent material, thereby reducing contamination of the liquid crystal layer due to a direct exposure of the column spacer to the liquid crystal layer.

Furthermore, a portion of the photoresist pattern used in the manufacturing process of the array substrate may be removed using the different heights of the portions of layers in and/or adjacent to the contact hole, thereby reducing manufacturing cost required to forming the low-reflective pattern.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
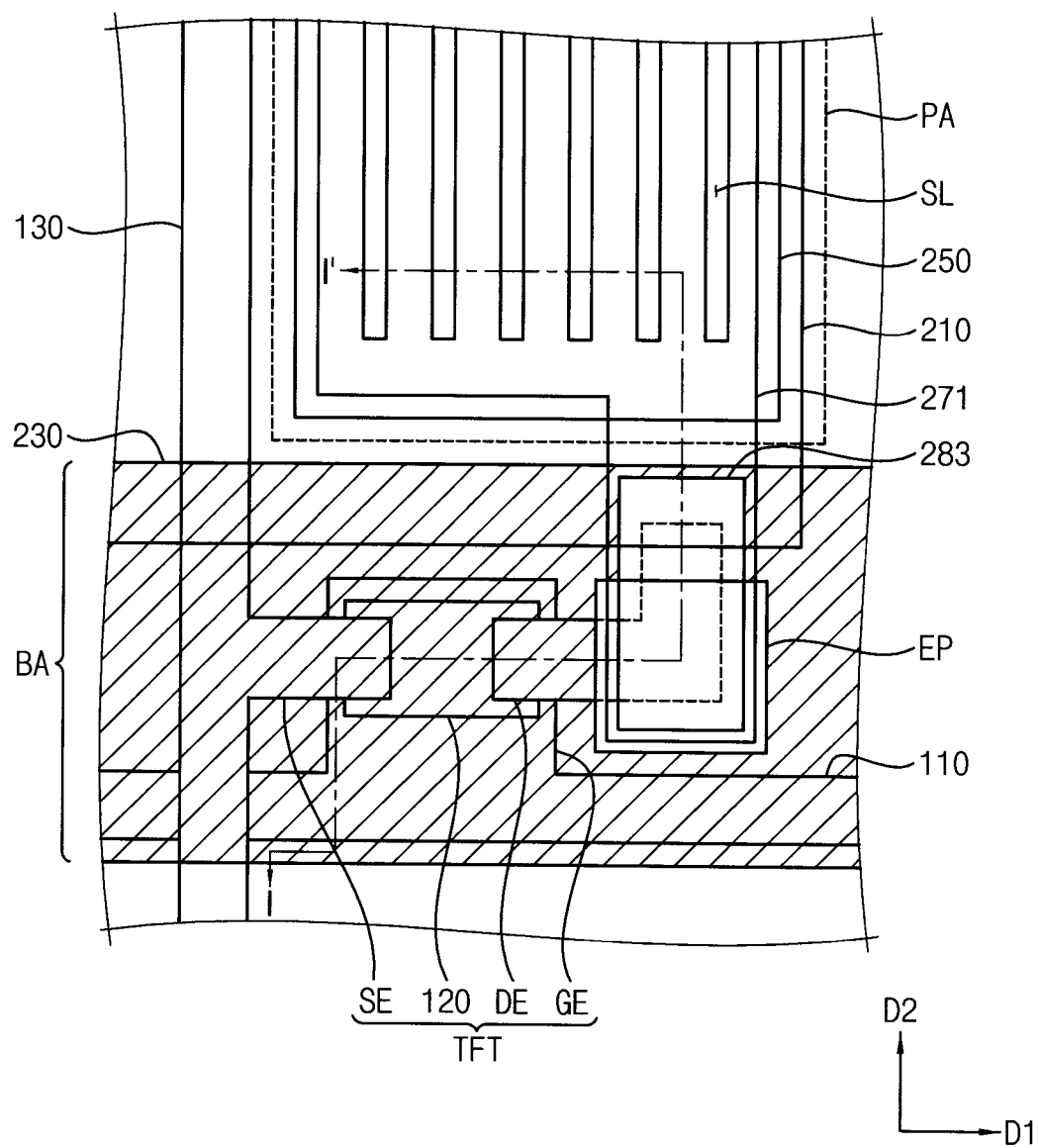
FIG. 1 is a plan view illustrating an exemplary embodiment of an array substrate according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "coupled to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

When aligning an array substrate with a facing substrate of a liquid crystal display ("LCD") device, a light blocking pattern on the facing substrate may not exactly correspond to the boundary of pixel areas of the LCD device, thereby reducing aperture ratio and display quality of the LCD device.

Also, when the light blocking pattern and a column spacer which maintains a cell gap between the array substrate and the facing substrate are disposed on the array substrate to reduce or effectively prevent the misaligning, the light blocking pattern or the column spacer with dark coloring may be directly exposed to a liquid crystal layer of the LCD device, thereby outgassing colored components into the liquid crystal layer and contaminating the liquid crystal layer. Therefore, there remains a need for an improved array substrate and a method of manufacturing the array substrate, reducing or effectively preventing misalignment of the array substrate and the facing substrate, and contamination of the liquid crystal layer.

Hereinafter, exemplary embodiments of the invention will be described in further detail with reference to the accompanying drawings.

Figure 2:
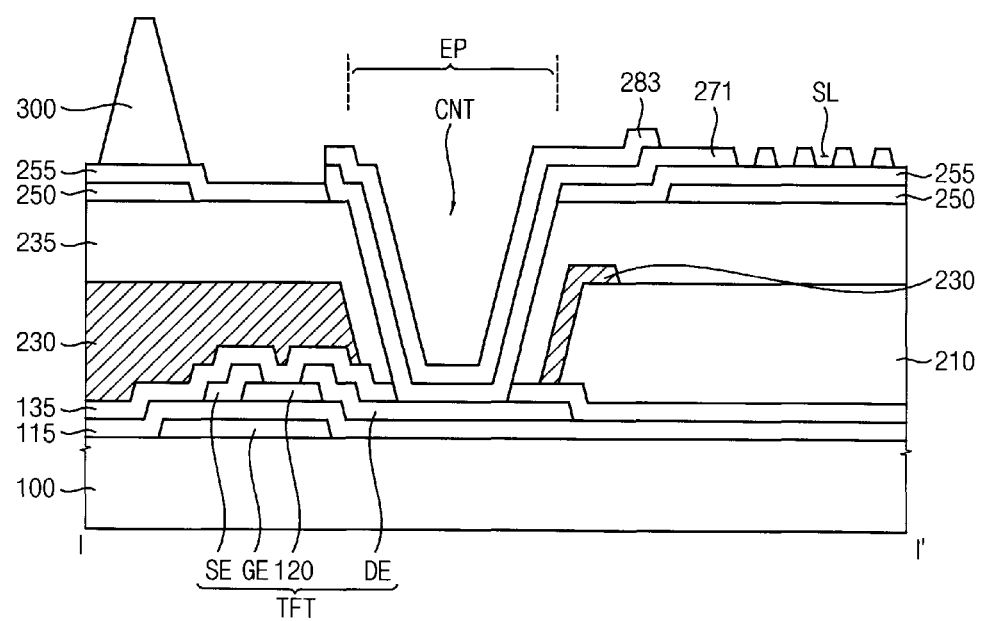
FIG. 2 is a cross-sectional view taken along line I-I' in FIG. 1.

FIG. 1 is a plan view illustrating an exemplary embodiment of an array substrate according to the invention. FIG. 2 is a cross-sectional view taken along line I-I' in FIG. 1.

Referring to FIGS. 1 and 2, an exemplary embodiment of an array substrate according to the invention includes a base substrate 100, a gate line 110, a gate insulation layer 115, a thin film transistor TFT, a data line 130, a first passivation layer 135, a color pattern 210, a light blocking pattern 230, an organic insulation layer 235, a common electrode pattern 250, a second passivation layer 255, a pixel electrode 271, a low-reflective pattern 283 and a column spacer 300. The array substrate may include one or more of the above mentioned elements, on the base substrate 100.

The thin film transistor TFT may include a gate electrode GE, a semiconductor pattern 120, a source electrode SE and a drain electrode DE. Although the thin film transistor TFT has a bottom-gate structure in FIG. 2, the structure of the thin film transistor of the array substrate according to the invention is not limited thereto. In one exemplary embodiment, for example, the thin film transistor of the array substrate may have a top-gate structure, a dual-gate structure, etc.

The base substrate 100 may include a transparent insulation substrate. In one exemplary embodiment, for example, the base substrate 100 may include glass, quartz, plastic, polyethylene terephthalate resin, polyethylene resin, polycarbonate resin, etc.

The gate line 110 may be elongated to extend in a first direction D1 on the base substrate 100. A gate on/off voltage may be applied to the gate line 110 from a gate driving part (not illustrated). The gate line 110 may include, for example, aluminum (Al), gold (Au), silver (Au), copper (Cu), iron (Fe), nickel (Ni), etc. These may be used alone or in a combination thereof. Also, the gate line 110 may include, for example, indium doped zinc oxide ("IZO:), gallium doped zinc oxide ("GZO"), etc.

The gate electrode GE may be physically and/or electrically connected to the gate line 110. The gate electrode GE may include substantially the same material as the gate line 110. In one exemplary embodiment, for example, the gate electrode GE may protrude lengthwise from the gate line 110 in a second direction D2 substantially perpendicular to the first direction D1. The gate electrode GE may be integral with the gate line 110, that is, the gate electrode GE and the gate line 110 may form a single, unitary, indivisible member.

The gate insulation layer 115 may be disposed on the base substrate 100 to cover the gate line 110 and the gate electrode GE. The gate insulation layer 115 may include a transparent insulation material such as, for example, silicon oxide, silicon nitride, etc.

The semiconductor pattern 120 may be disposed on the gate insulation layer 115. The semiconductor pattern 120 may overlap the gate electrode GE. The semiconductor pattern 120 may include, for example, indium (In), zinc (Zn), gallium (Ga), tin (Sn), hafnium (Hf), etc. In one exemplary embodiment, for example, the semiconductor pattern 120 may include an oxide semiconductor such as, for example, indium gallium zinc oxide ("IGZO"), indium tin zinc oxide ("ITZO"), hafnium indium zinc oxide ("HIZO"), etc.

The data line 130 may be disposed on the gate insulation layer 115. The data line 130 may be elongated to extend in the second direction D2. In one exemplary embodiment, a pixel area PA may be defined by the data line 130 and the gate line 110, but the invention is not limited thereto or thereby. A data voltage may be applied to the data line 130 from a data driving part (not shown). The data line 130 may include substantially the same material as the gate line 110. In one exemplary embodiment, for example, the data line 130 may include for example, aluminum (Al), gold (Au), silver (Au), copper (Cu), iron (Fe), nickel (Ni), an alloy thereof, etc.

The source electrode SE may be disposed on the gate insulation layer 115 to overlap a first end portion of the semiconductor pattern 120. The source electrode SE may be physically and/or electrically connected to the data line 130. In one exemplary embodiment, for example, the source electrode SE may protrude lengthwise from the data line 130 in the first direction D1. The source electrode SE may be integral with the data line 130, that is, the source electrode SE and the data line 130 may form a single, unitary, indivisible member.

The drain electrode DE may be spaced apart from the source electrode SE. The drain electrode DE may be disposed on the gate insulation layer 115 to overlap a second end portion of the semiconductor pattern 120 opposing the first end portion thereof. The drain electrode DE may include substantially the same material as the source electrode SE. In one exemplary embodiment, for example, the source electrode SE and the drain electrode DE may include aluminum (Al), gold (Au), silver (Au), copper (Cu), iron (Fe), nickel (Ni), etc. These may be used alone or in a combination thereof. The drain electrode DE may be a discrete element having an island-shape, but not being limited thereto.

The first passivation layer 135 may cover the source electrode SE and the drain electrode DE. The first passivation layer 135 may include substantially the same material as the gate insulation layer 115. In one exemplary embodiment, for example, the first passivation layer 135 may include silicon oxide, silicon nitride, etc.

The color pattern 210 may be disposed on the first passivation layer 135. The color pattern 210 may overlap the pixel area PA. The color pattern 210 may include an organic material having a desired color. In one exemplary embodiment, for example, the color pattern 210 may include a photoresist material having red, green and/or blue color. The color pattern 210 may partially overlap an end portion of the drain electrode DE in a plan view.

The light blocking pattern 230 may overlap the gate line 110 and the thin film transistor TFT. The light blocking pattern 230 may be disposed on the first passivation layer 135 corresponding to a pixel boundary BA which is between adjacent pixel areas PA. An opening portion EP may be defined in the light blocking pattern 230 and partially expose a portion of the drain electrode DE. In the illustrated exemplary embodiment, the light blocking pattern 230 may be elongated to extend in the first direction D1 to cover the gate line 110 and the thin film transistor TFT. Also, a plurality of opening portions EP may be defined in the light blocking pattern 230 respectively corresponding to contact holes CNT along a pixel row. Although it is not illustrated in the figure, the light blocking pattern 230 may further extend in the second direction D2 to cover a portion of the data line 130. Also, the light blocking pattern 230 may further extend in the second direction D2 to partially overlap the color pattern 210. A first height of a portion of the light blocking pattern 230 overlapped with the color pattern 210 may be substantially greater than a second height of a portion of the light blocking pattern 230 not overlapped with the color pattern 210. Referring to the cross-sectional view of FIG. 2, for example, a height the portion of the light blocking pattern 230 overlapped with the color pattern 210 to the right of the contact hole CNT is greater than that of the portion of the light blocking pattern 230 not overlapped with the color pattern 210 to the left of the contact hole CNT, the heights taken from a common element such as an upper surface of the base substrate 100. A difference between the first height and the second height may have a desired thickness. The light blocking pattern 230 may include, for example, a dark color or black material such as inorganic black material, organic black material, etc.

The organic insulation layer 235 may cover the light blocking pattern 230 and the color pattern 210. The organic insulation layer 235 may have substantially flat surface. The organic insulation layer 235 may include, for example, acryl resin, phenol resin, etc. The organic insulation layer 235 may reduce outgassing of a material such as the black material of the light blocking pattern 230. Accordingly, contamination of a liquid crystal layer on the array substrate may be reduced. That is, the organic insulation layer 235 is between the light blocking pattern 230 and the liquid crystal layer (not shown).

The common electrode pattern 250 may be disposed on the organic insulation layer 235 overlapping the color pattern 210. The common electrode pattern 250 may correspond to the pixel area PA. A common voltage may be applied to the common electrode pattern 250. The common electrode pattern 250 may include, for example, IZO, indium tin oxide ("ITO"), tin oxide (SnOx), zinc oxide (ZnOx), etc.

The second passivation layer 255 may be disposed on the organic insulation layer 235 to cover the common electrode pattern 250. The second passivation layer 255 may include substantially the same material as the first passivation layer 135. In one exemplary embodiment, for example, the second passivation layer 255 may include silicon oxide, silicon nitride, etc.

The contact hole CNT may be defined in the first passivation layer 135, the organic insulation layer 235 and the second passivation layer 255 and corresponding to the opening portion EP, to expose a portion of the drain electrode DE. The contact hole CNT may overlap and/or be aligned with the opening portion EP in the plan view of the array substrate.

The pixel electrode 271 may correspond to the pixel area PA. A first end portion of the pixel electrode 271 may be electrically connected to the drain electrode DE through the contact hole CNT. A plurality of slits SL may be defined in the pixel electrode 271 in the pixel area PA. The pixel electrode 271 may include a transparent conductive material. In one exemplary embodiment, for example, the pixel electrode 271 may include IZO, ITO, tin oxide (SnOx), zinc oxide (ZnOx), etc.

The low-reflective pattern 283 may be disposed on the pixel electrode 271 corresponding to the opening portion EP. The low-reflective pattern 283 may overlap the opening portion EP of the light blocking pattern 230. In one exemplary embodiment, for example, the low-reflective pattern 283 may entirely cover the opening portion EP, not being limited thereto. An area, such as a total planar area, of the low-reflective pattern 283 may be substantially greater than that of the opening portion EP in the light blocking pattern, in a plan view of the array substrate. The low-reflective pattern 283 may extend further than an edge of the opening portion EP. The low-reflective pattern 283 may include an opaque metal having a low reflectivity such as, for example, chromium (Cr), nickel (Ni), molybdenum (Mo), titanium (Ti), an oxide thereof, etc. As the low-reflective pattern 283 includes a metal having a low reflectivity, light-leakage from a backlight source (not shown) through the opening portion EP in the organic insulating layer 235 may be reduced. Also, outward reflecting by external light may be reduced due to the low-reflective pattern 283.

The column spacer 300 may be disposed on the second passivation layer 255 at the pixel boundary BA overlapping the light blocking pattern 230. The column spacer 300 may maintain a cell gap of the liquid crystal layer between the array substrate and a facing substrate (not shown) of a LCD device. The column spacer 300 may include a transparent material without an additional dark-colored material because the column spacer 300 may overlap the light blocking pattern 230. Accordingly, although the column spacer 300 is directly exposed to the liquid crystal layer, contamination of the liquid crystal layer due to the column spacer 300 may be reduced.

As mentioned above, according to one or more exemplary embodiment of the array substrate, the light blocking pattern 230 disposed on the array substrate may be covered by the organic insulation layer 235, and the opening portion EP in the light blocking pattern 230 corresponding to the contact hole CNT may be covered by the low-reflective pattern 283, thereby reducing contamination of the liquid crystal layer due to the light blocking pattern 230 and reducing light-leakage from a backlight source through the contact hole CNT.

Also, the column spacer 300 disposed on the array substrate may include a transparent material instead of a light-blocking material, thereby reducing contamination of the liquid crystal layer due to a direct exposure of the column spacer to the liquid crystal layer.

Figure 3A:
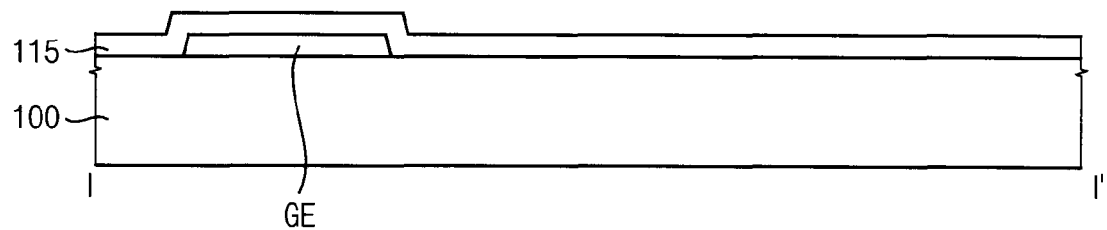
FIGS. 3A to 3P are cross-sectional views illustrating an exemplary embodiment of a method of manufacturing an array substrate according to the invention.
Figure 3B:
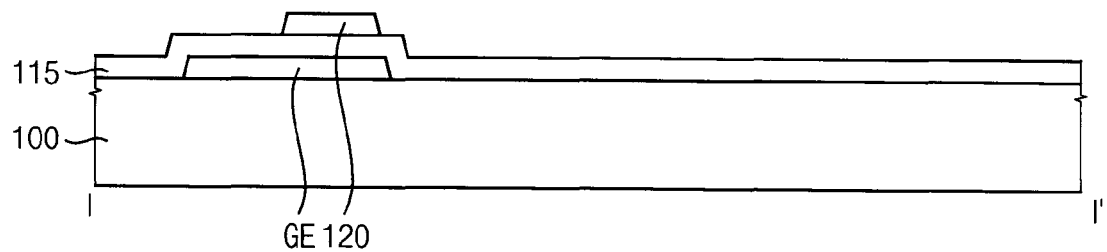
Figure 3C:
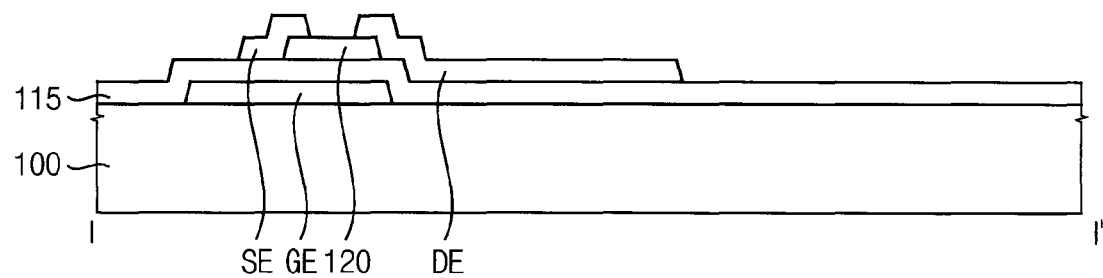
Figure 3D:
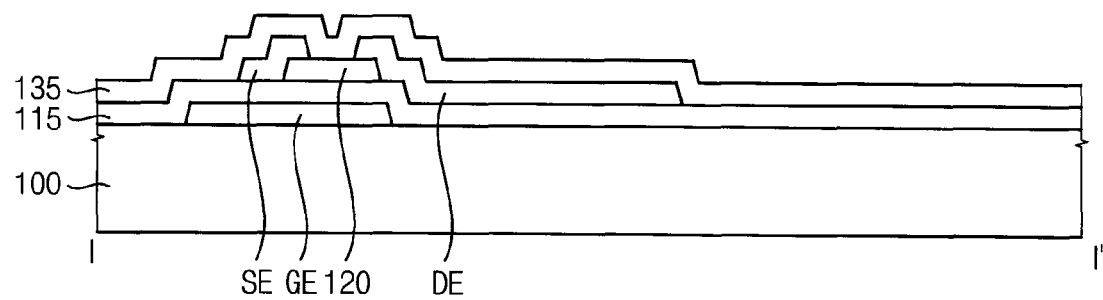
Figure 3E:
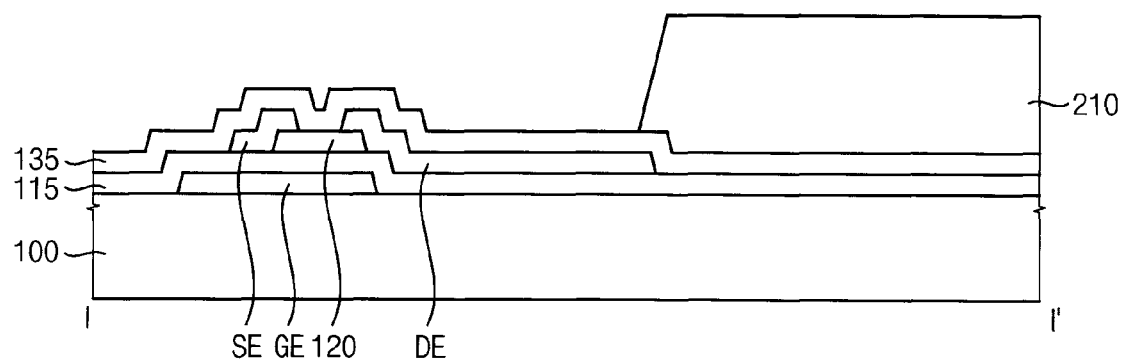
Figure 3F:
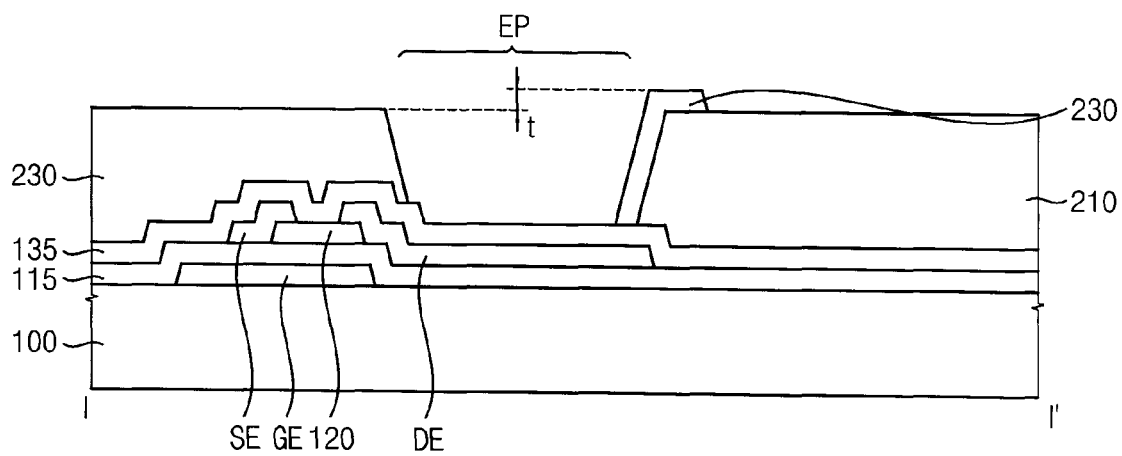
Figure 3G:
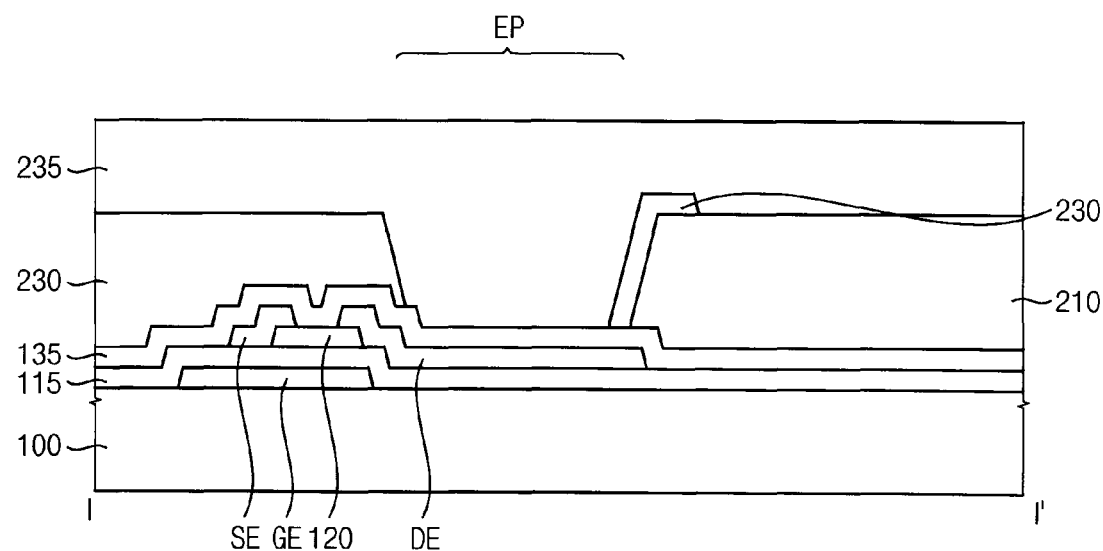
Figure 3H:
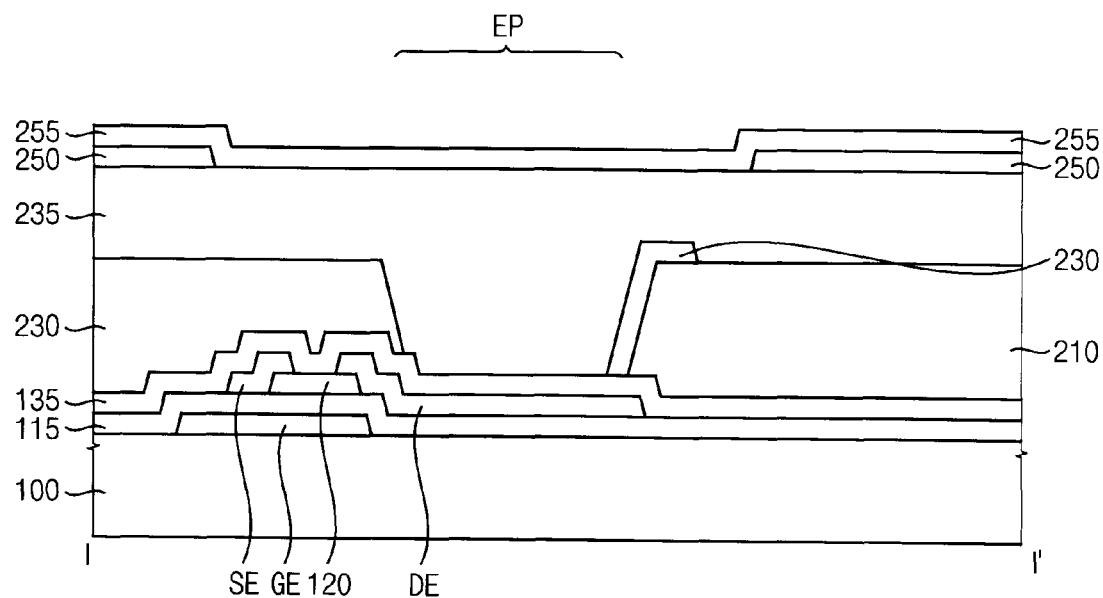
Figure 3I:
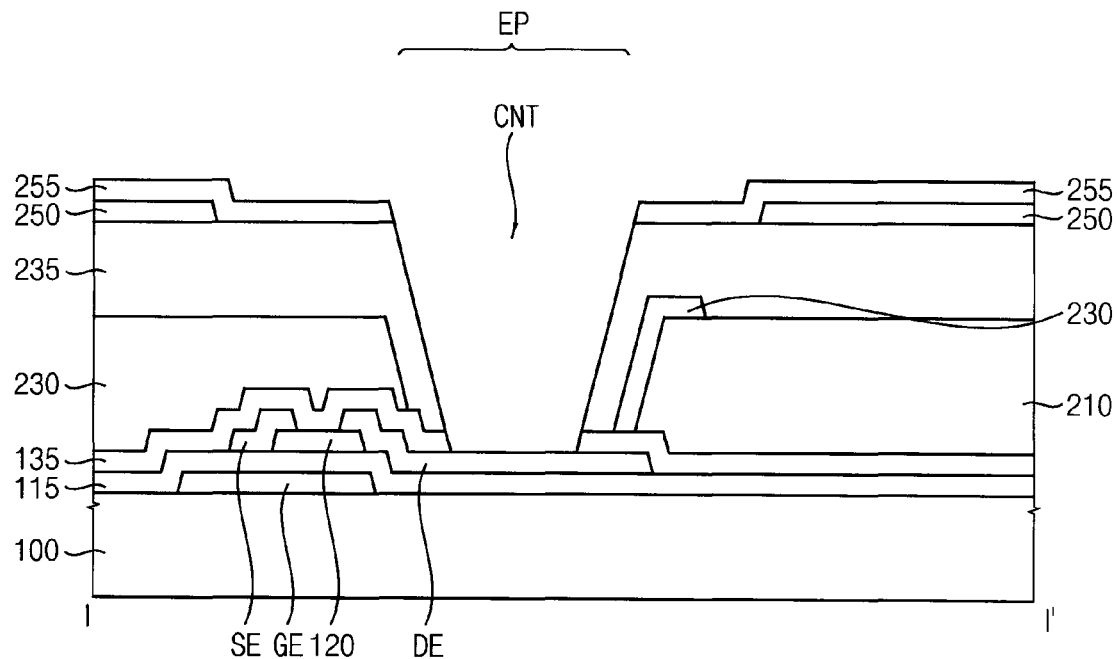
Figure 3J:
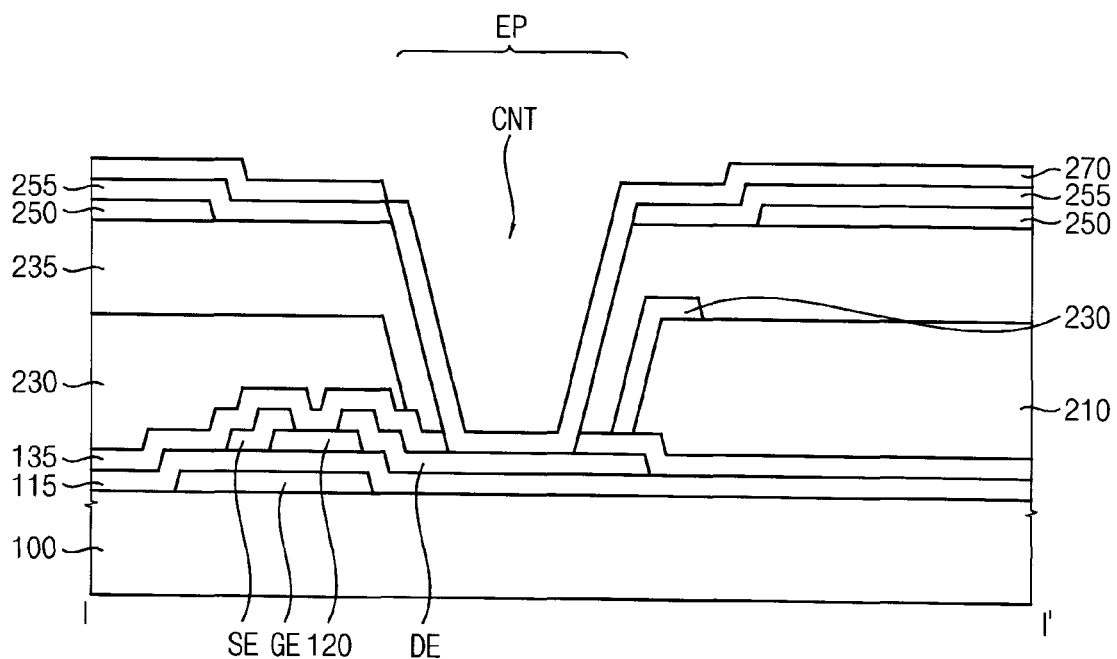
Figure 3K:
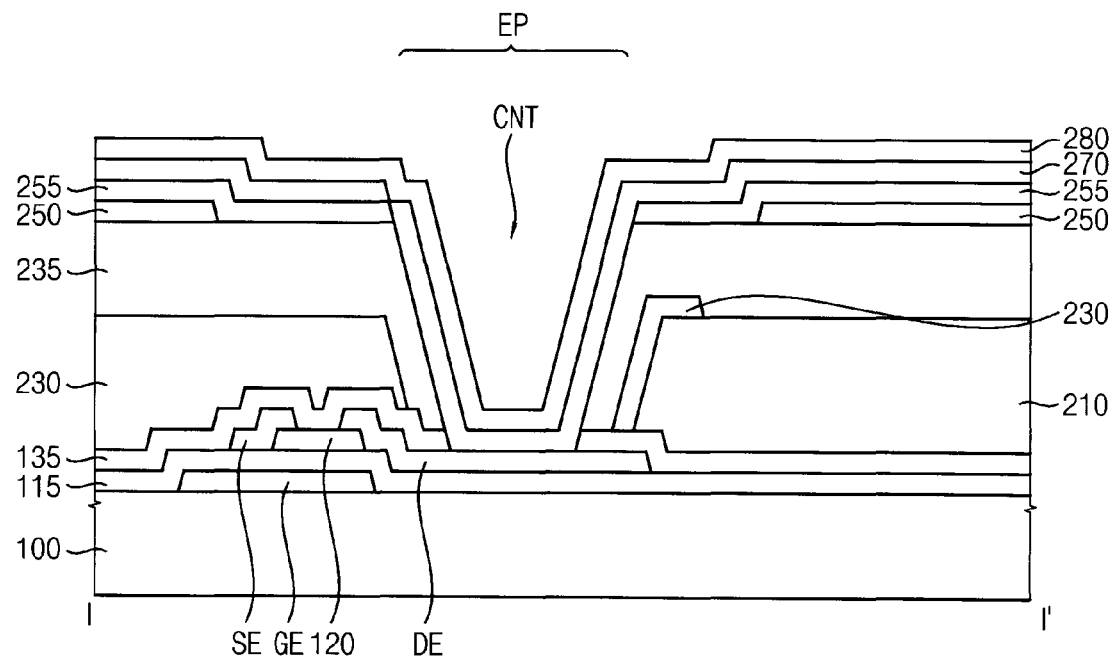
Figure 3L:
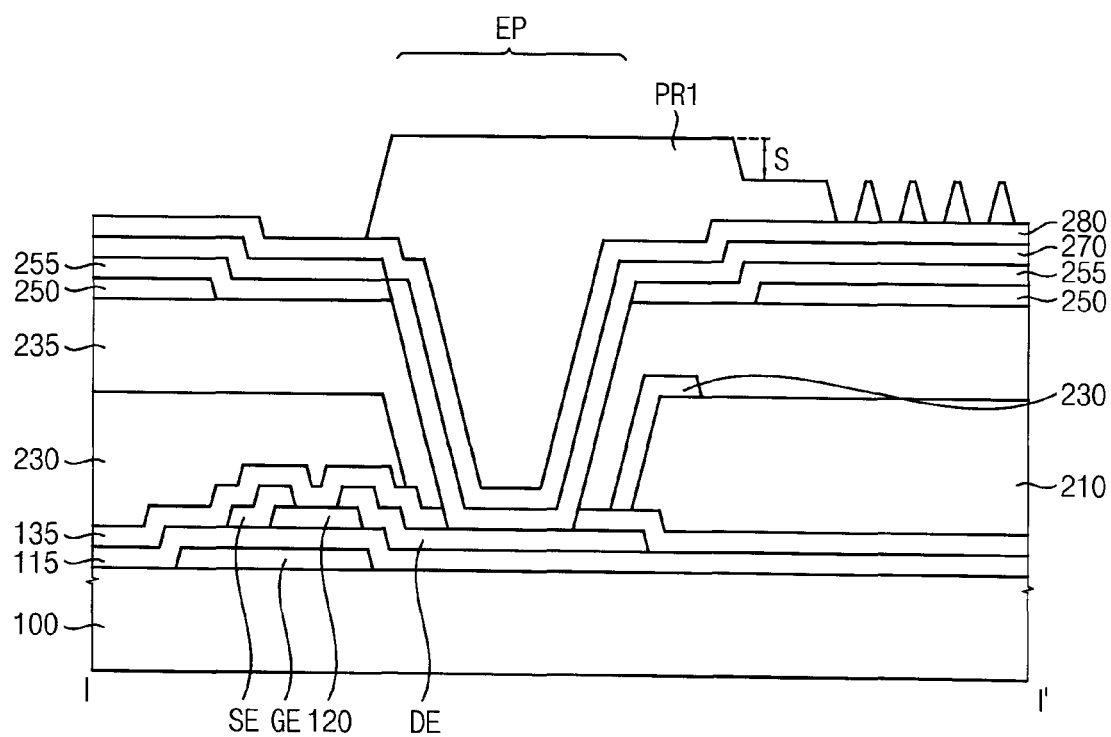
Figure 3M:
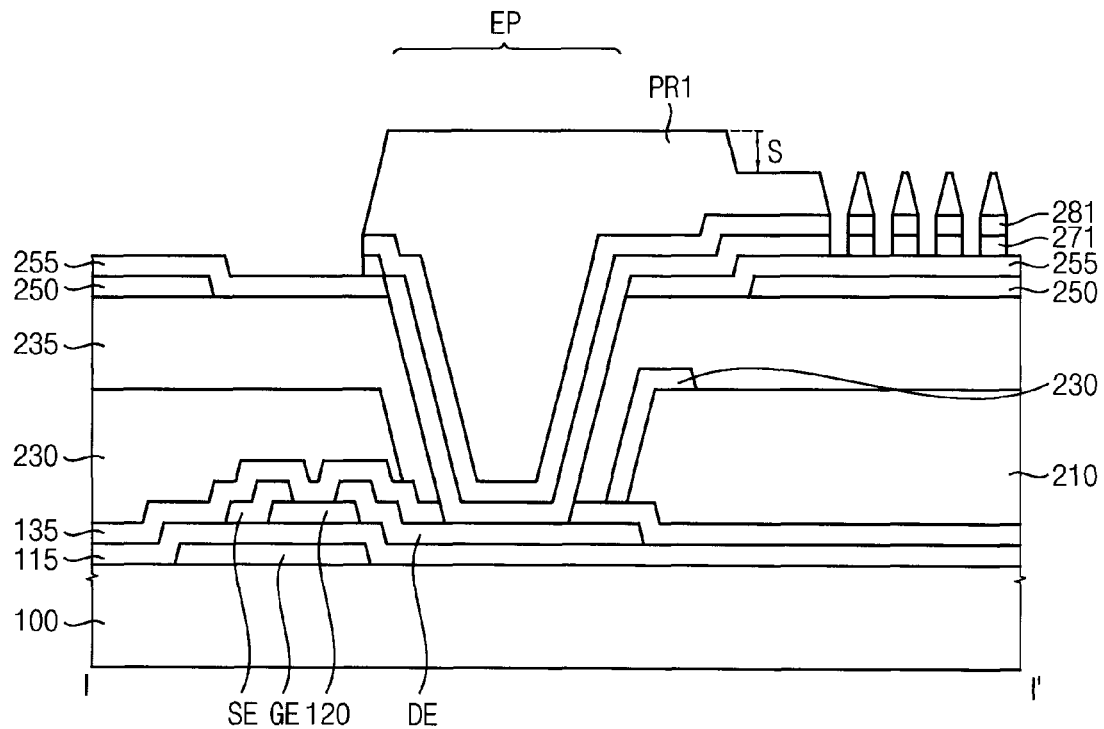
Figure 3N:
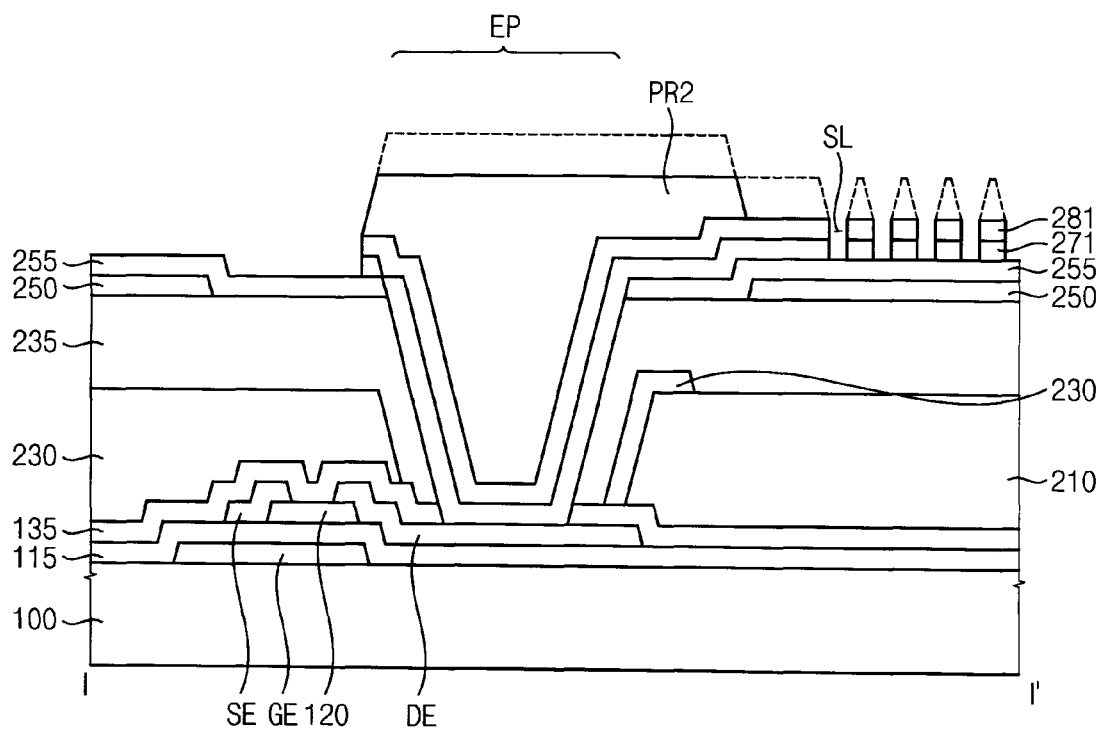
Figure 3O:
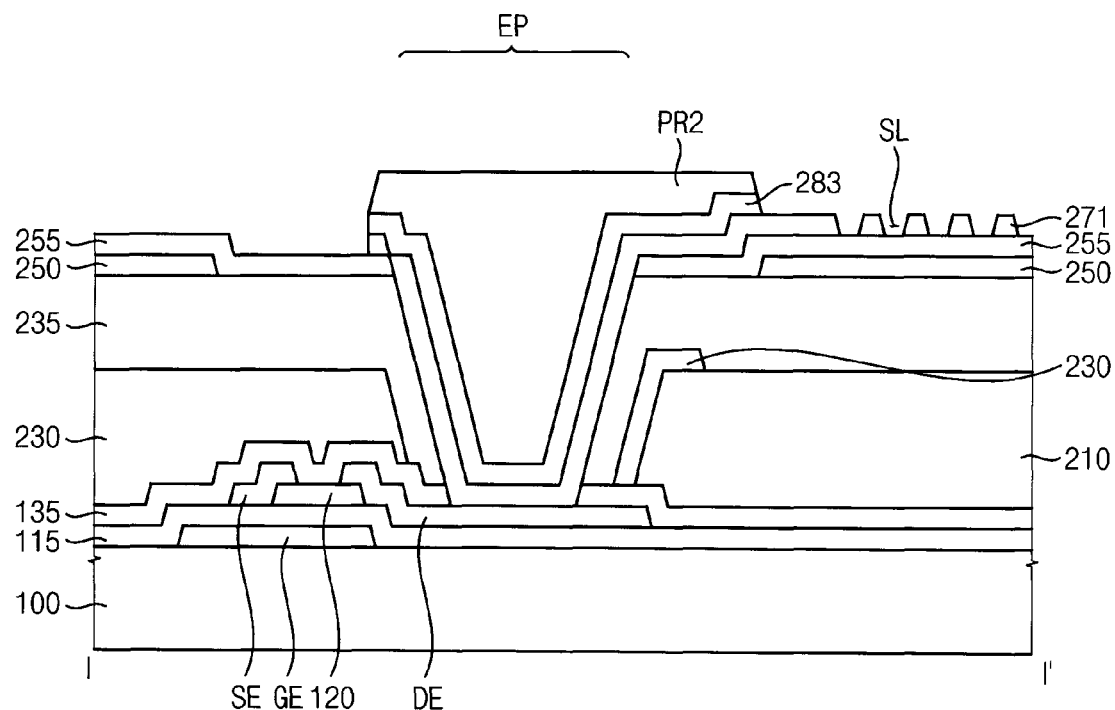
Figure 3P:
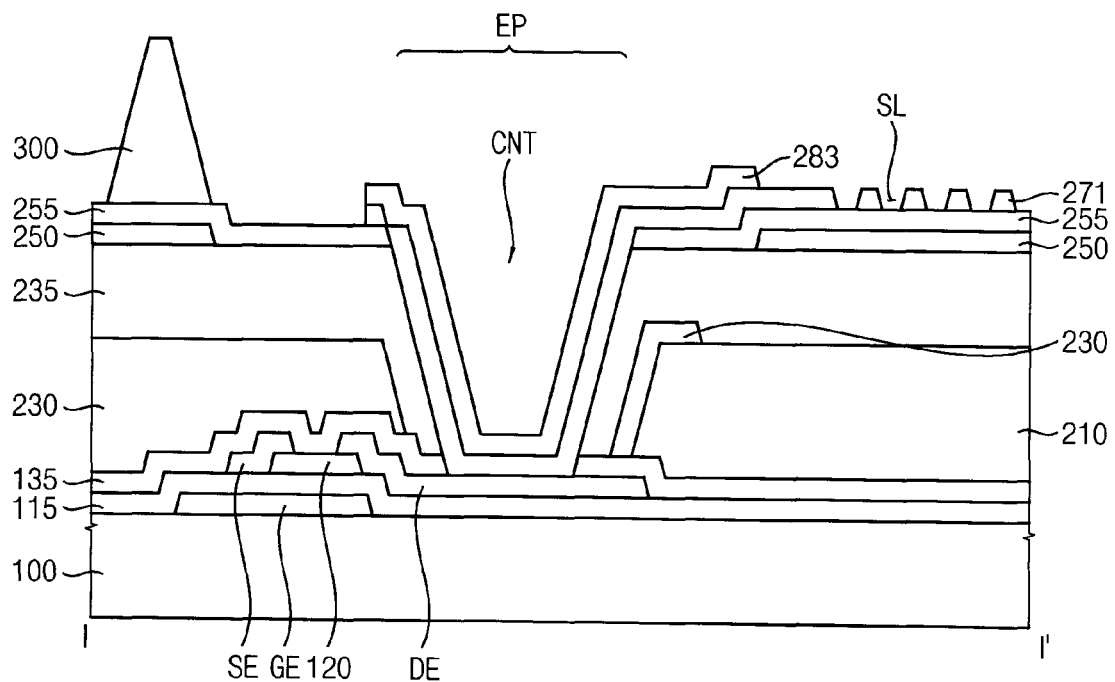

FIGS. 3A to 3P are cross-sectional views illustrating an exemplary embodiment of a method of manufacturing an array substrate according to the invention.

Referring to FIG. 3A, a gate line and a gate electrode GE may be formed (e.g., provided) on a base substrate 100. A gate insulation layer 115 may be formed on the gate line and the gate electrode GE. The gate insulation layer 115 may include a transparent insulation material.

Referring to FIG. 3B, a semiconductor pattern 120 may be formed on the gate insulation layer 115. The semiconductor pattern 120 may overlap the gate electrode GE. The semiconductor pattern 120 may include, for example, indium (In), zinc (Zn), gallium (Ga), tin (Sn), hafnium (Hf), etc.

Referring to FIG. 3C, a source electrode SE may formed to overlap a first end portion of the semiconductor pattern 120, and a drain electrode DE may be formed to overlap a second end portion of the semiconductor pattern 120 opposing the first end portion thereof. The source electrode SE and the drain electrode DE may be formed by patterning a metal layer. The source electrode SE and the drain electrode DE may be formed by patterning a same metal layer, such that the source and drain electrodes SE and DE include a same material as each other and are in a same layer of the array substrate. The source electrode SE and the drain electrode DE may include, for example, copper (Cu), copper oxide (CuOx), etc.

Referring to FIG. 3D, a first passivation layer 135 is formed on the base substrate 100 including the source electrode SE and the drain electrode DE thereon. The first passivation layer 135 may include, for example, silicon oxide, silicon nitride, etc.

Referring to FIG. 3E, a color pattern 210 may be formed on the first passivation layer 135 corresponding to a pixel area. The color pattern 120 may include, for example, a colored photoresist material. The color pattern 210 may overlap an end portion of the drain electrode DE.

Referring to FIG. 3F, a light blocking pattern 230 may be formed on the base substrate 100 including the color pattern 210 thereon. An opening portion EP may be defined in the light blocking pattern 230 and corresponding to a portion of the drain electrode DE. The opening portion EP exposes the portion of the drain electrode DE. The light blocking pattern 230 partially overlap the color pattern 210. A first height of a portion of the light blocking pattern 230 overlapping the color pattern 210 may be substantially greater than a second height of a portion of the light blocking pattern 230 non-overlapping the color pattern 210, taken from a common element. As illustrated in FIG. 3F, for example, the difference between the first height and the second height of the light blocking pattern may have a desired thickness t. The difference in heights may be taken from the uppermost surfaces of the portion of the light blocking pattern 230 overlapping the color pattern 210 and the portion of the light blocking pattern 230 non-overlapping the color pattern 210.

Referring to FIG. 3G, an organic insulation layer 235 may be formed on the base substrate 100 including the light blocking pattern 230 and the color pattern 210 thereon. The organic insulation layer 235 may entirely cover the light blocking pattern 230 and the color pattern 210. The organic insulation pattern 235 may have substantially flat surface, such as a planar upper surface.

Referring to FIG. 3H, a common electrode pattern 250 may be formed on the organic insulation pattern 235. A second passivation layer 255 may cover the common electrode pattern 250. The common electrode pattern 250 may include a transparent conductive material. The second passivation layer 255 may include substantially the same material as the first passivation layer 135. The common electrode pattern 250 may overlap the color pattern 210.

Referring to FIG. 3I, a contact hole CNT may be formed in the second passivation layer 255, the organic insulation layer 235 and the first passivation layer 135 corresponding to the opening portion EP. The contact hole CNT may expose a portion of the drain electrode DE. The contact hole CNT may entirely overlap the opening portion EP in a plan view, and may be aligned and continuous with the opening portion EP.

Referring to FIGS. 3J and 3K, a pixel electrode layer 270 and a low-reflective metal layer 280 may be sequentially formed on the base substrate 100 on which the contact hole CNT is formed. The pixel electrode layer 270 may be physically and/or electrically connected to the drain electrode DE through the contact hole CNT.

Referring to FIG. 3L, a first photoresist pattern PR1 having a desired cross-sectional thickness may be formed on the base substrate 100 including the pixel electrode layer 270 and the low-reflective metal layer 280 thereon. A plurality of slit portions spaced apart from each other may be defined in the first photoresist pattern PR1 in a pixel area overlapping the color pattern 210. A first height of a portion of the first photoresist pattern PR1 corresponding the opening portion EP may be substantially greater than a second height of a portion of the first photoresist pattern PR1 not corresponding to the opening portion EP, by a thickness S. In an exemplary embodiment, the first photoresist pattern PR1 may be formed by forming a photoresist material on the low-reflective metal layer 280, and exposing and developing the photoresist material using a half-toned mask. A light transmissivity of the half-toned mask corresponding to the opening portion EP may be substantially different from a light transmissivity of the half-toned mask corresponding to another region of the array substrate structure.

Referring to FIG. 3M, exposed portions of the low-reflective metal layer 280 and the pixel electrode layer 270 may be sequentially etched using the first photoresist pattern PR1 as a mask. The low-reflective metal layer 280 and the pixel electrode layer 270 may be, for example, dry-etched using a desired etchant. The low-reflective metal layer 280 and the pixel electrode layer 270 may be etched to form a low-reflective intermediate pattern 281 and a pixel electrode pattern 271. A plurality of slits SL may be defined in the pixel electrode pattern 271 corresponding to the slit portions of the first photoresist pattern PR1.

Referring to FIG. 3N, the first photoresist pattern PR1 may be partially removed to form a remaining second photoresist pattern PR2 on the opening portion EP. The second photoresist pattern PR2 may be formed by entirely removing a desired thickness of the first photoresist pattern PR1 to expose the low-reflective intermediate pattern 281. A portion of the low-reflective intermediate pattern 281 corresponding to the pixel area PA may be exposed by the second photoresist pattern PR2.

Referring to FIG. 3O, the exposed portion of the low-reflective intermediate pattern 281 may be removed using the second photoresist pattern PR2 as a mask. The low-reflective intermediate pattern 281 may be etched to form a low-reflective pattern 283 and to expose the pixel electrode pattern 271 in the pixel area PA. The second photoresist pattern PR2 may be removed after the low-reflective pattern 283 is formed.

Referring to FIG. 3P, a column spacer 300 may be formed on the base substrate 100 including the low-reflective pattern 283 thereon. The column spacer 300 may overlap the light blocking pattern 230. The column spacer 300 may include a transparent material.

As mentioned above, according to one or more exemplary embodiment of the array substrate, the light blocking pattern 230 disposed on the array substrate may be covered by the organic insulation layer 235, and the opening portion EP in the light blocking pattern 230 corresponding to the contact hole CNT may be covered by the low-reflective pattern 283, thereby reducing contamination of the liquid crystal layer due to the light blocking pattern 230 and reducing light-leakage from a backlight source through the contact hole CNT.

FIGS. 4A to 4F are cross-sectional views illustrating another exemplary embodiment of a method of manufacturing an array substrate according to the invention.

Figure 4A:
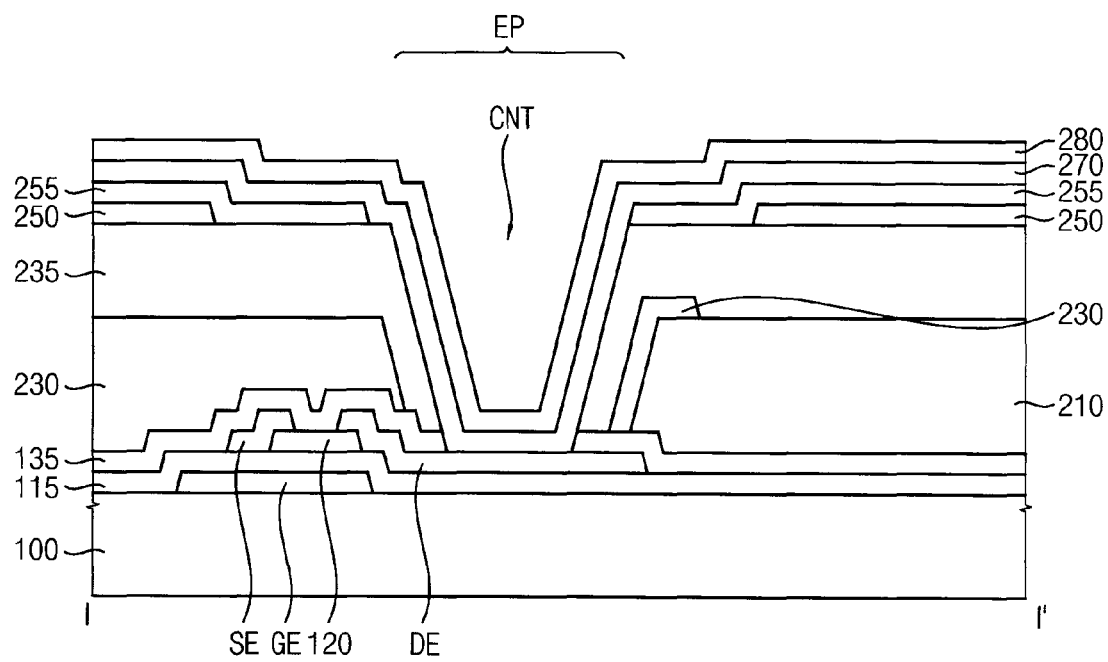
FIGS. 4A to 4F are cross-sectional views illustrating another exemplary embodiment of a method of manufacturing an array substrate according to the invention.

FIG. 4A illustrates substantially the same cross-section as FIG. 3K. Therefore, manufacturing processes illustrated in FIGS. 3A to 3K may also be pre-applied to the array substrate in FIG. 4A. Hereinafter, post-processes of a pixel electrode layer 270 and a low-reflective metal layer 280 are described below.

Figure 4B:
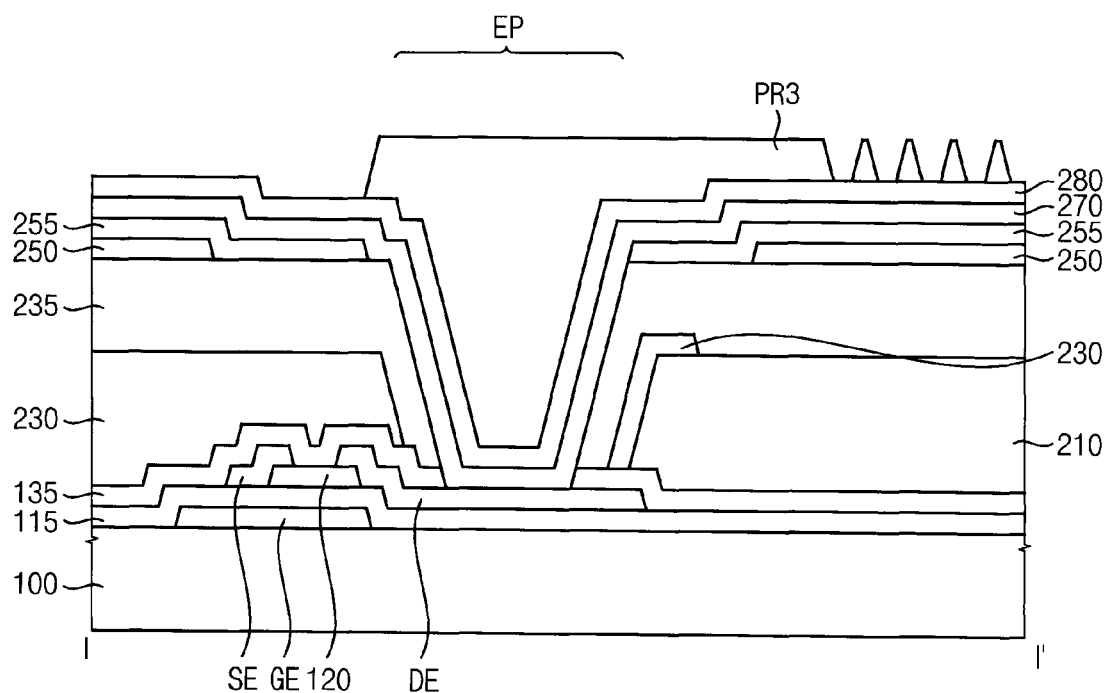

Referring to FIG. 4B, a third photoresist pattern PR3 having a desired height may be formed on the base substrate 100 including the low-reflective metal pattern 280 thereon. Contrary to the first photoresist pattern PR1 in FIG. 3L, the third photoresist pattern PR3 may have a substantially predetermined and uniform height, that is, without the step different S shown in FIG. 3L. Therefore, the third photoresist pattern PR3 may be formed by forming a photoresist material on the low-reflective metal layer 280, exposing and developing the photoresist material using a single-toned mask. A plurality of slit portions spaced apart from each other may be defined in the third photoresist pattern PR3 in a pixel area PA overlapping the color pattern 210.

Figure 4C:
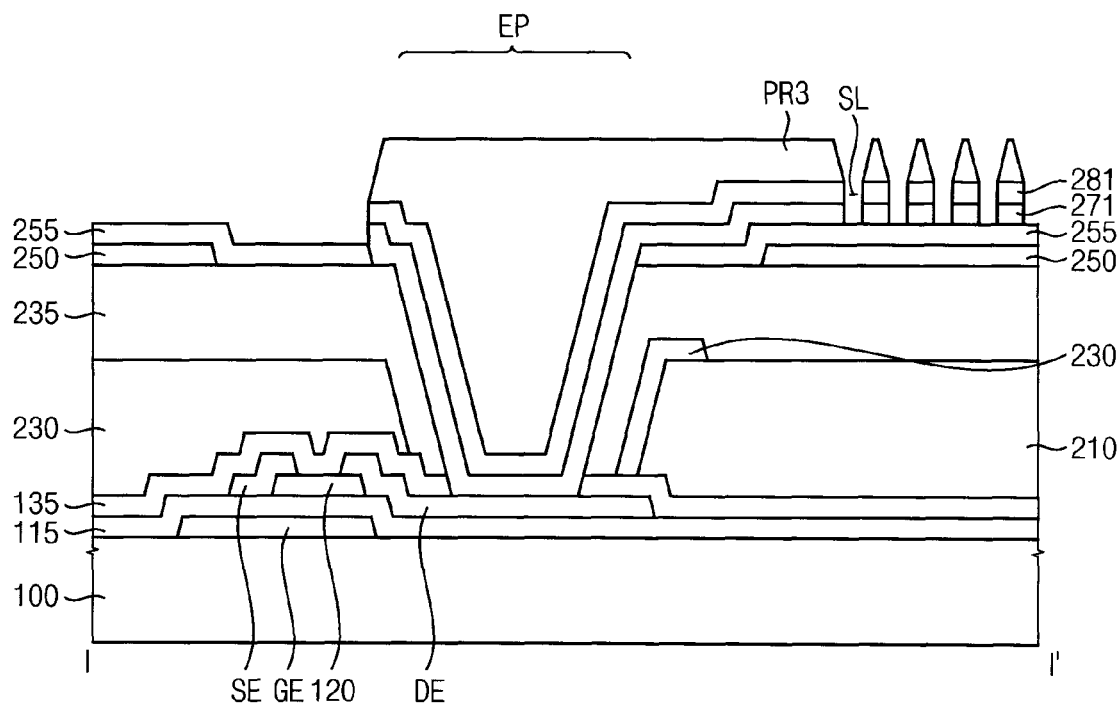

Referring to FIG. 4C, exposed portions of the low-reflective metal layer 280 and the pixel electrode layer 270 may be sequentially etched using the third photoresist pattern PR3 as a mask. The low-reflective metal layer 280 and the pixel electrode layer 270 may be, for example, dry-etched using a desired etchant. The low-reflective metal layer 280 and the pixel electrode layer 270 may be etched to form a low-reflective intermediate pattern 281 and a pixel electrode pattern 271. A plurality of slits SL may be defined in the pixel electrode pattern 271 in the pixel area corresponding to the slit portions in the third photoresist pattern PR3.

Figure 4D:
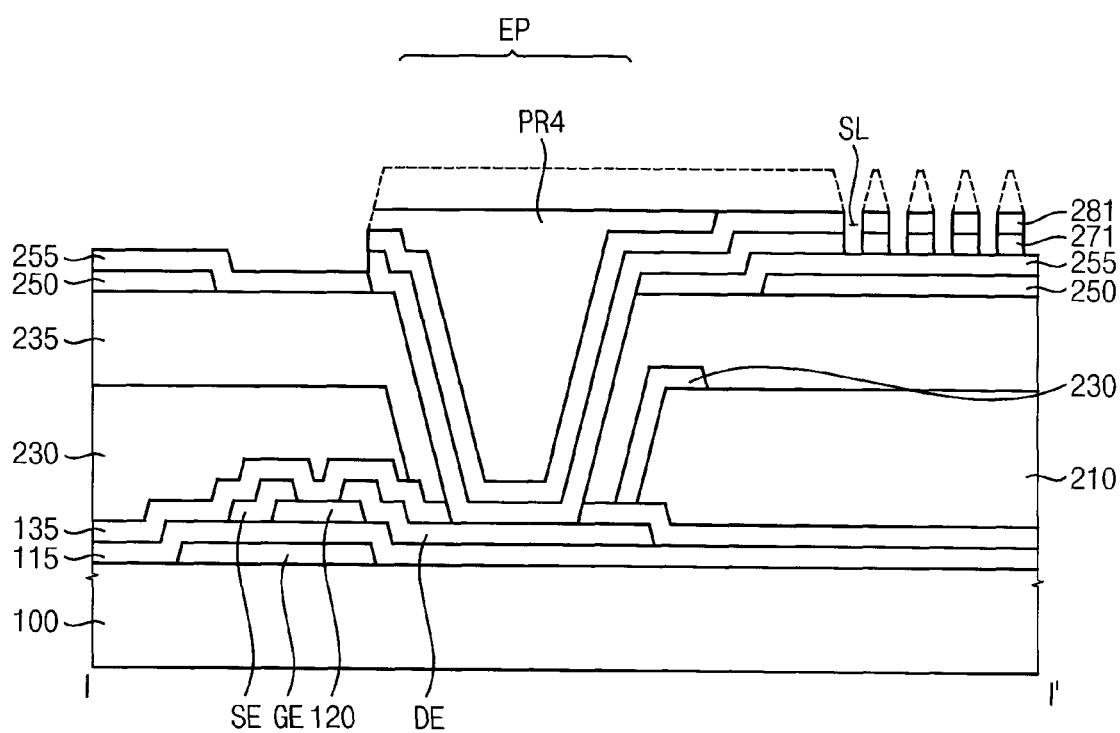

Referring to FIG. 4D, the third photoresist pattern PR3 may be partially removed to form a remaining fourth photoresist pattern PR4 on the opening portion EP. The fourth photoresist pattern PR4 may be formed by removing a desired thickness of the third photoresist pattern PR3 to expose the low-reflective intermediate pattern 281. A portion of the low-reflective intermediate pattern 281 corresponding to the pixel area may be exposed by the fourth photoresist pattern PR4.

Figure 4E:
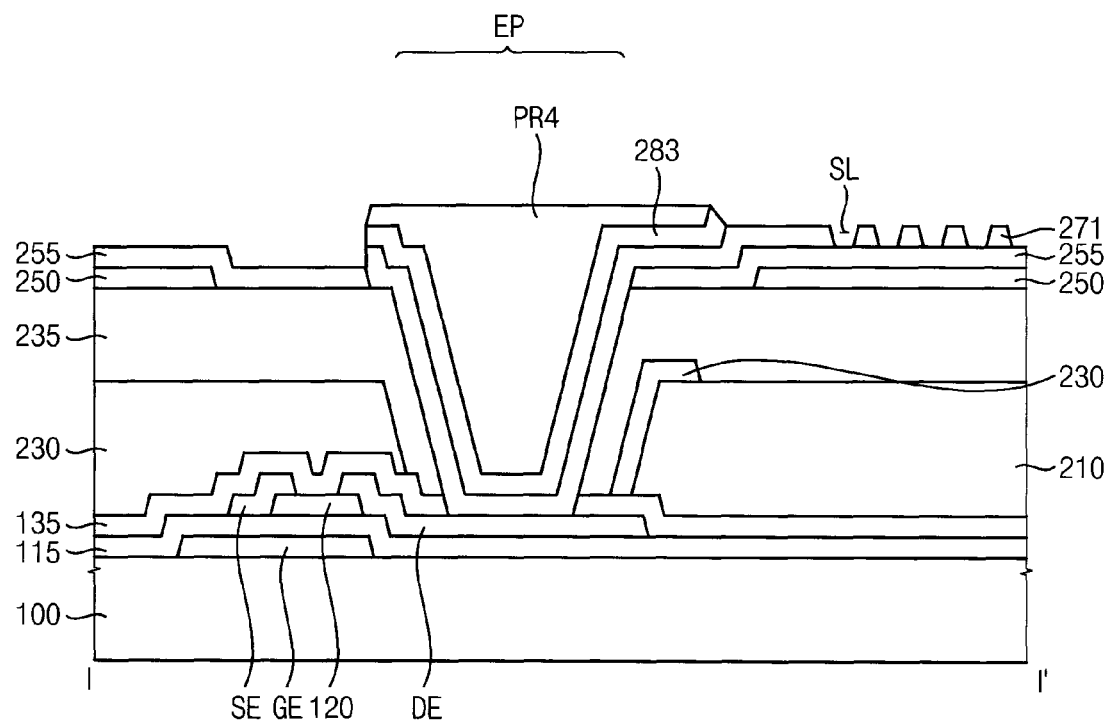

Referring to FIG. 4E, the exposed portion of the low-reflective intermediate pattern 281 may be removed using the fourth photoresist pattern PR4 as a mask. The low-reflective intermediate pattern 281 may be etched to form a low-reflective pattern 283 and expose the pixel electrode pattern 271 in the pixel area. The fourth photoresist pattern PR4 may be removed after the low-reflective pattern 283 is formed.

Figure 4F:
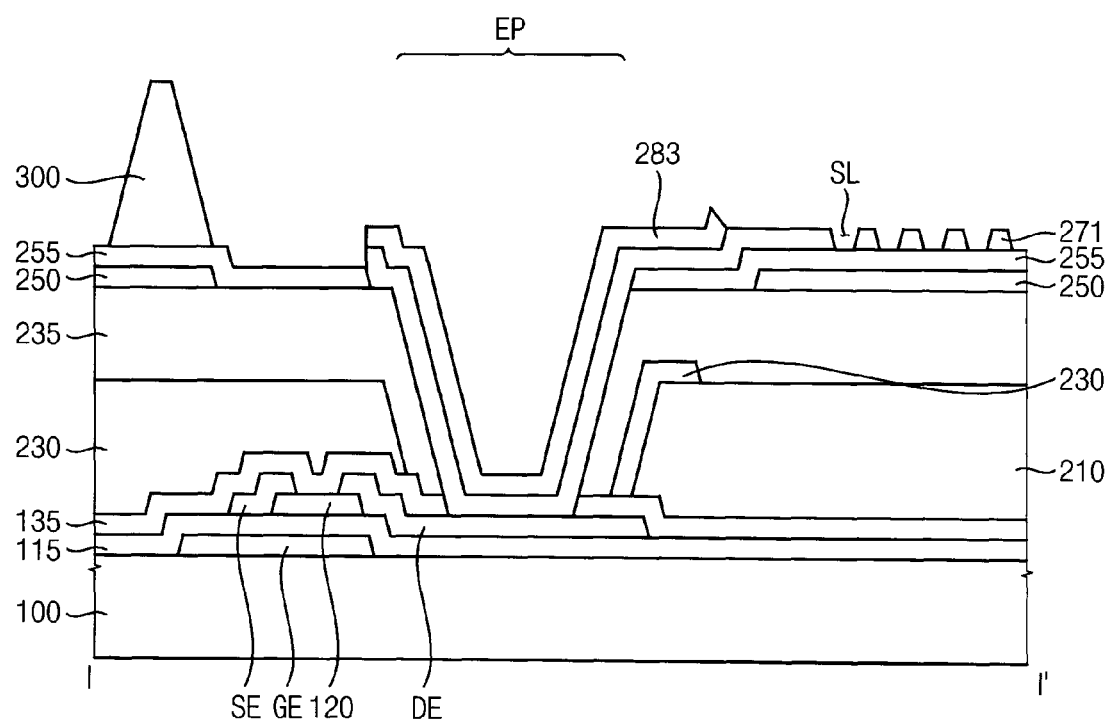

Referring to FIG. 4F, a column spacer 300 may be formed on the base substrate 100 including the low-reflective pattern 283 thereon. The column spacer 300 may overlap the light blocking pattern 230. The column spacer 300 may include a transparent material.

Therefore, according to one or more exemplary embodiment of the method of manufacturing the array substrate, a portion of the third photoresist pattern PR3 may be removed using a height difference of portions of layers in and/or adjacent to the contact hole CNT without a half-toned mask, thereby reducing manufacturing cost required to forming the low-reflective pattern 283.

As mentioned above, according to one or more exemplary embodiment of the array substrate and the method of manufacturing the array substrate, the light blocking pattern disposed on the array substrate may be covered by the organic insulation layer, and an opening portion in the light blocking pattern corresponding to the contact hole may be covered by the low-reflective pattern, thereby reducing contamination of the liquid crystal layer due to the light blocking pattern and reducing light-leakage from a backlight source through the contact hole.

Also, the column spacer disposed on the array substrate may include a transparent material, thereby reducing contamination of the liquid crystal layer due to a direct exposure of the column spacer.

Furthermore, a portion of the photoresist pattern used in the manufacturing process of the array substrate may be removed using the height difference of the portions of the layers in and/or adjacent to the contact hole, thereby reducing manufacturing cost required to forming the low-reflective pattern.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the invention. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An array substrate comprising:
 a thin film transistor on a substrate;
 a color pattern on the substrate;
 a light blocking pattern overlapping the thin film transistor, and an opening portion defined in the light blocking pattern and exposing the thin film transistor;
 an organic insulation layer covering the color pattern and the light blocking pattern, and a contact hole defined in the organic insulation layer and corresponding to the opening portion in the light blocking pattern;
 a pixel electrode on the organic insulation layer and electrically connected to the thin film transistor through the contact hole; and
 a low-reflective pattern overlapping the pixel electrode corresponding to the opening portion.

2. The array substrate of claim 1, wherein the low-reflective pattern comprises an opaque metal.

3. The array substrate of claim 2, wherein the low-reflective pattern comprises chromium, nickel, molybdenum, titanium, or an oxide thereof.

4. The array substrate of claim 1, further comprising a column spacer on the organic insulation layer and overlapping the light blocking pattern.

5. The array substrate of claim 4, wherein the column spacer comprises a transparent material.

6. The array substrate of claim 1, wherein
 a portion of the light blocking pattern overlaps the color pattern, and
 a first height of the portion of the light blocking pattern overlapping the color pattern is greater than a second height of a portion of the light blocking pattern exposing the color pattern, the heights taken with respect to the substrate.

7. The array substrate of claim 1, further comprising a plurality of slits defined in the pixel electrode.

8. The array substrate of claim 1, wherein the color pattern comprises a colored photoresist material.

9. The array substrate of claim 1, wherein the thin film transistor comprises:
    a gate electrode on the substrate;
    a semiconductor pattern overlapping the gate electrode; and
    a source electrode and a drain electrode both electrically connected to the semiconductor pattern.

10. The array substrate of claim 1, wherein an area of the low-reflective pattern is greater than an area of the opening portion in the light blocking pattern, in a plan view.

* * * * *